United States Patent [19]

Hallford

[11] Patent Number: 4,500,847
[45] Date of Patent: Feb. 19, 1985

[54] TRANSISTOR AMPLIFIER VARIABLE MATCHING TRANSFORMER APPARATUS

[75] Inventor: Ben R. Hallford, Wylie, Tex.

[73] Assignee: Rockwell International Corporation, El Segundo, Calif.

[21] Appl. No.: 388,291

[22] Filed: Jun. 14, 1982

[51] Int. Cl.³ .............................................. H03F 3/16
[52] U.S. Cl. .................................................. 330/277
[58] Field of Search ................... 330/277, 307; 333/35

[56] References Cited

U.S. PATENT DOCUMENTS 4,390,851  6/1983  Higgins et al. ...................... 330/277

OTHER PUBLICATIONS

Young, Leo, "The Quarter-Wave Transformer Prototype Circuit," Sep. 1960, pp. 483–488.
YIRE Transaction on Microwave Theory and Techniques.

Primary Examiner—James B. Mullins
Assistant Examiner—G. Wan
Attorney, Agent, or Firm—Bruce C. Lutz; V. Lawrence Sewell; H. Fredrick Hamann

[57] ABSTRACT

A variable transformer is illustrated to be used primarily with high frequency transistors and other high frequency amplifying means to provide optimum impedance matching characteristics for individual transistors in a circuit rather than trying to design a given circuit to be universally applicable to a range of transistor characteristic values.

8 Claims, 6 Drawing Figures

| TABLE OF REFLECTION COEFFICIENTS | | | |
|---|---|---|---|
| CONDITIONS | FREQUENCY – GHz | | |
|  | 5.9 | 6.15 | 6.4 |
| OPTIMUM $\Gamma_o$ | 0.746 /93.4° | 0.736 /100.8° | 0.708 /120.8° |
| FIXED TRANSFORMER $\Gamma$ | 0.727 /105.5° | 0.736 /100.8° | 0.744 /96.2° |
| VARIABLE TRANSFORMER $\Gamma$ | 0.731 /96.1° | 0.731 /100.8° | 0.731 /118.5° |

TRANSISTOR AMPLIFIER VARIABLE MATCHING TRANSFORMER APPARATUS

THE INVENTION

The present invention is directed generally to electronics and more specifically to high frequency transistor amplifier circuits. Even more specifically, the invention is related to the impedance matching of a transmission line to a transistor to reduce noise and increase gain.

As is well-known to those skilled in the art, transistor parameters are not predictable to any reasonable degree of accuracy and thus transistors are normally selected to meet certain specifications for a given end use. The narrower the range of specifications which are required, the greater the selection process and therefore the higher the cost of the transistor. Thus, in implementing a circuit, the cost of the circuit varies as a function of the range of parameters that can be tolerated for the transistors incorporated in the circuit.

All of these problems are greatly exacerbated when dealing with high frequency transistors. When incorporating transistors in microstrip lines, some type of matching needs to be provided between the input and output leads of the transistor and the transmission lines. Typically, fixed transformers or matching circuits have been designed which are supposed to cover a variety of frequencies of operation and a range of parameters in the various parameter specifications of the transistors. If the transistors do not provide the required gain and noise level, pieces of metal are soldered to the microstrip at strategic locations to increase the performance level of the transistor or in the alternative, at times, the width of the microstrip conductor is decreased to obtain a desired end result such as increased line impedance.

The present invention uses a variable transformer to provide a match for any specific transistor inserted into the circuit at a center frequency of operation.

While the fixed tuners designed for use with all transistors decrease the reflection coefficient angle with increase in frequency, the present invention satisfies the matching requirements of typical transistor amplifiers wherein the reflection coefficient angle must increase with frequency to provide satisfactory performance over the design frequency range.

It is thus an object of the present invention to provide an improved impedance matching circuit in the form of a variable transformer.

Other objects and advantages of the present invention may be ascertained from a reading of the specification and appended claims in conjunction with the drawings wherein:

DETAILED DESCRIPTION

Figures 1, 6:
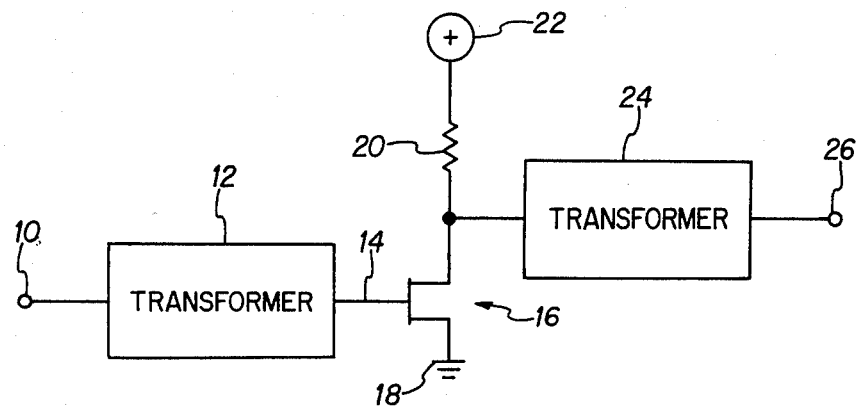
FIG. 1 is a schematic diagram illustrating an FET transistor having transformers attached to the gate signal input means and the source signal output means.
FIG. 6 is a table illustrating the reflection coefficients for different frequencies and conditions.

In FIG. 1 an input terminal 10 supplies signals to a transformer means or matching means block 12 which is connected via a lead 14 to a gate of an MESFET or other FET transistor or amplifier generally designated as 16. The source of FET 16 is connected to ground 18 while the drain is connected through a resistor 20 to a positive potential 22. The drain of FET 16 is also connected through a transformer means or matching means block 24 to an output terminal 26. The FET 16 can easily be replaced by those skilled in the art with transistors wherein the terminals are base, emitter and collector or other solid state devices since the inventive concept is in the transformer means 12 and/or the transformer means 24 rather than in the specific semiconductor device utilized for amplifier 16.

Figure 2:
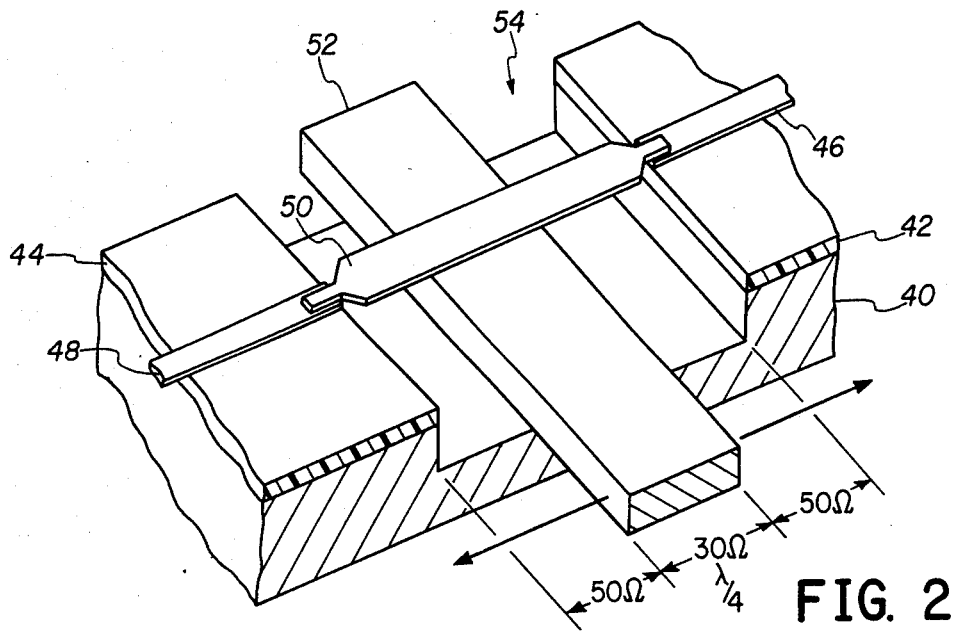
FIG. 2 is a basic representation of how the variable transformer might be implemented using an elevated ground plane.

In FIG. 2 a metallic ground plane or conductive means 40 is shown with dielectric 42 and 44 situated thereupon. Attached to dielectric 42 is a transmission line or conductive path 46 while a further conductive path 48 is shown attached to dielectric 44. A connecting microstrip element 50 is shown connected from transmission line 46 to transmission line 48. A movable conductor element or means 52 is shown between a cutout 54 in conductive means 40 and the conductive element 50. This element 52 is one quarter-wavelength wide and in connection with the element 50 provides a low ohm impedance path which, in one embodiment, was 30 ohms for the quarter-wavelength distance whereas the remainder of the conductive element 50 on either side of element 52 is a higher (characteristic) line impedance which, in the referenced embodiment, was 50 ohms.

Figure 3:
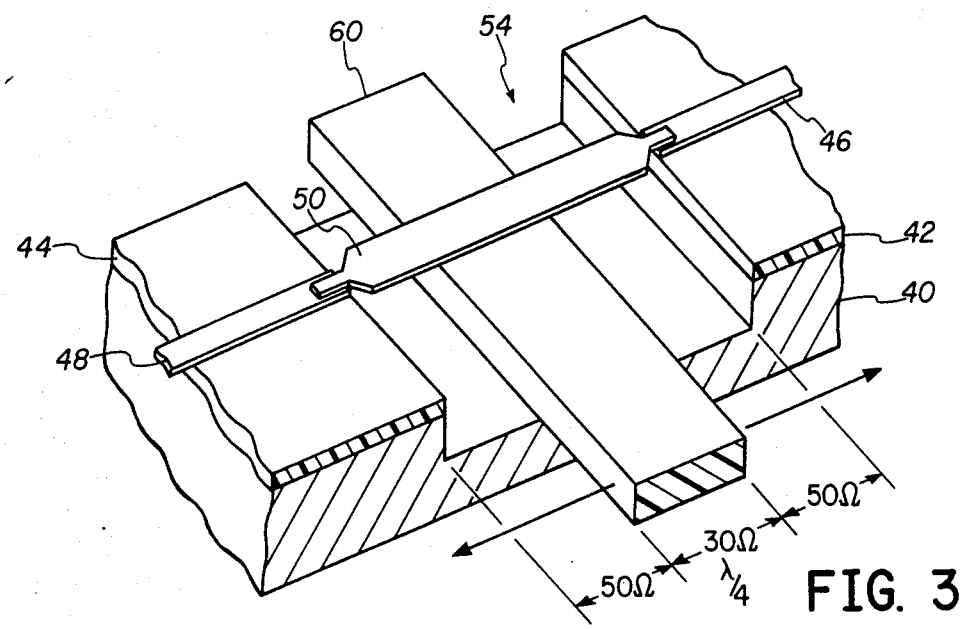
FIG. 3 is a representation of how the variable transformer may be implemented using a dielectric step.

In FIG. 3 the same numbers or designators are used as in FIG. 2. The only difference is that instead of conductive movable element 52, there is a movable dielectric element 60. Element 60 is also one quarter-wavelength wide as was the case in FIG. 2 and because of interaction with element 50 provides, for instance, a 30 ohm impedance path for the width of the element 60 in the same manner as occurred in connection with FIG. 2.

Figure 4:
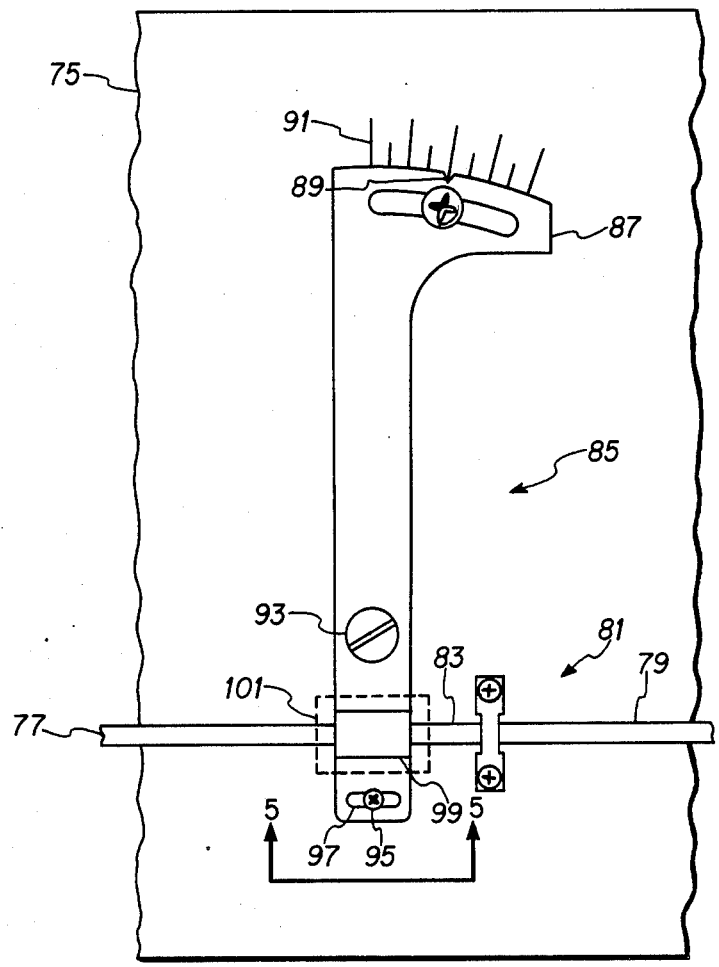
FIG. 4 is a top view illustration of one present implementation of the inventive concept using a quarter-wave conductor adjacent the transmission line but separated therefrom by a piece of insulation or dielectric.

In FIG. 4 a cutaway portion of a printed circuit board 75 is shown with a conductive element 77 at one edge and a conductive element 79 at the other edge. Element 79 is connected to the drain of an FET transistor generally designated as 81 having a gate lead 83 which is connected to transmission means or conductive element 77 beneath a portion of an arm generally designated as 85. Arm 85 has an expanded area 87 with a notch 89 which is used in conjunction with indicia 91. A pivot point is illustrated by a screw 93. The setting of arm 85 is kept in place by a screw 95 situated within a slot 97 at the lower end of arm 85. Between pivotal screw 93 and slot 97 is a conductive strip or element 99 which is one quarter-wavelength in width. Metallic element 99 provides a low impedance section between elements 77 and 83 and provides the transforming action to optimally terminate the gate of FET 81.

Figure 5:
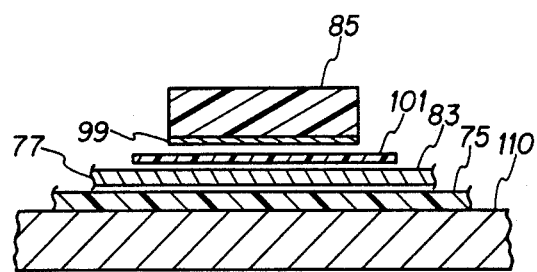
FIG. 5 is a cross-sectional view of a portion of FIG. 4.

FIG. 5 illustrates a cross section through the apparatus of FIG. 4 along the axis of the conductor 77–83. As illustrated in FIG. 5, a ground plane 110 has a layer of dielectric 75 mounted thereon with the conductor 77 appearing on one side of center and on top of dielectric 75 and conductor 83 on the opposite side of center. The last mentioned numbers or designators are the same as shown in FIG. 4. A piece of thin Therma-Film or other separating or insulating material 101 is placed contiguous the conductor element 77-83 to separate the conductor from electrical contact with the conductive pattern 99 mounted on the lower side of arm 85.

The table of FIG. 6 shows the reflection coefficients for various frequencies as illustrated under the conditions of (1) OPTIMUM, (2) A FIXED TRANSFORMER AND (3) A VARIABLE TRANSFORMER. Condition 2 shows the reflection coefficient of a fixed transformer versus operating frequency illustrating a decreasing angle as frequency increases. Condition 3 represents the situation of a variable position transformer of the present invention adjusted for optimum performance at each operating frequency.

An insulative material 101 is shown situated between arm 85 and the conductor 77 to prevent sporadic metallic contact between these two conductors thereby altering the reflection coefficient for different positions in an ambiguous fashion.

OPERATION

In order for a transistor amplifier to operate efficiently, it must "see" the appropriate impedance at the source. To obtain maximum gain, the source and load impedances at the transistor terminal should be conjugately matched. A different impedance is required to obtain an optimum noise match. As illustrated in FIG. 6, the optimum impedance and angle is illustrated for each of three frequencies from 5.9 gigahertz to 6.4 gigahertz. As will be noted, the reflection coefficient angle increases as a direct function of frequency increase. The prior art, that uses matching stubs or a fixed transformer to achieve a broad band, compromise noise and gain match. This results in a reflection coefficient which decreases as a function of frequency. This is illustrated in the second set of figures in FIG. 6. Finally, the last set of figures shows that reflection coefficient with a predetermined setting of a variable transformer increases in a manner very close to that which would provide optimum results. The term "variable transformer" in the context of this disclosure is meant to refer to a transformer which can be set to a given reflection coefficient magnitude and to cause its angle to be a function of transformer position. The term "fixed transformer" refers to a transformer with a physically fixed position to the transistor.

As is known by those skilled in the art, a microstrip quarter-wavelong transformer width is directly related to the reflection coefficient magnitude. The position of the transformer, relative the component, affects the phase of the reflection coefficient for a given frequency of operation. Typically, the transformer for the purposes of the present invention, is a rectangular shaped thin strip of metal that is cemented to the tuner arm in the embodiment of FIG. 4. The arm 85 is moved along the path provided by the slots in the arm wherein the distance from the transistor 81 to the transformer changes and thus changes the reflection coefficient angle. As previously mentioned, the plastic dielectric 101 is inserted between the transformer 99 of arm 85 and the conductor 77 to avoid metal-to-metal electrical contact.

In designing the transformer, the usual design procedure for a low noise amplifier is followed. The noise figure and gain circles are drawn on a Smith chart for the high, mid and low operating frequencies.

A reflection coefficient magnitude $\Gamma°$ is chosen for the input and output FET (or other amplifier) loads that will give the required gain and noise figures. This magnitude will then define the size of the matching transformer. The reflection coefficient angles at the frequency extremes will give the required range of the travel for the tuner. The impedance $Z_{IN}$ may be calculated from Equation (1) below where $\Gamma°$ is the optimum or required reflection coefficient as determined from the Smith chart, the angle $\theta$ is the phase or reflection coefficient angle as determined from the Smith chart and $Z_O$ is the impedance of the transmission line joining the transformer to the FET.

$$Z_{IN} = \frac{(1 - |\Gamma o|^2)Z_0 + j(2 Z_0 |\Gamma o| \sin\theta)}{1 + |\Gamma o|^2 - 2|\Gamma o| \cos\theta} \quad (1)$$

Next, this impedance must be normalized to the value of the transmission line coming from the source to the transformer. This calculated impedance $Z_{IN}$ is obtained from Equation (2) wherein R is the real value of $Z_{IN}$ as obtained in Equation 1 and X is the quadrature value obtained from Equation (1).

$$Z_{IN} = R + jX \quad (2)$$

The results of the calculation of FIG. 2 are placed in the form shown in Equation (3). Here $Z_1$ is the impedance of the connecting transmission line.

$$Z_{IN} = \frac{R}{Z_1} + j\frac{X}{Z_1} \quad (3)$$

$$= .157 + j.497 = R_N + jX_N \quad (4)$$

The reflection coefficient number $\Gamma N$ is calculated from the Equation 5 listed below where all of the values are defined above.

$$\Gamma N = \frac{\sqrt{(R_N^2 + X_N^2 - 1)^2 + (2 X_N)^2}}{(R_N + 1)^2 + X_N^2} \bigg/ \tan^{-1}\left(\frac{2 X_N}{R_N^2 + X_N^2 - 1}\right) \quad (5)$$

The reflection coefficient as ascertained from Equation 5 is then used on the Smith chart to find the pure resistance. This pure resistance is then multiplied times the normalized impedance to find a true resistance $R_2$. The $R_2$ value may now be matched to the impedance of the transmission line between the transformer and the component by using a quarter-wave transformer which has an impedance that is the geometric mean of the two impedances. The transformer impedance $Z_T$ may be ascertained from Equation 6 where $R^2$ is the true resistance mentioned above and $Z_O$ is the load impedance of the component and its incoming transmission line.

The matching transformer must then be a device equivalent to a transmission line having impedance $Z_O$ that is a quarter-wavelength at the center frequency of operation. The length of the line between the transformer and the component or FET must be an electrical length equivalent to a reflection coefficient angle which ranges in angle between those angles allowed by the Smith chart. The transformer impedance $Z_T$ is ascertainable from Equation (6) below.

We will call the transformer impedance $Z_T$ and find its value.

$$Z_I = \sqrt{(R_2)(Z_0)} \tag{6}$$

Since design information for designing optimum size transformers are relatively well-known to those skilled in the art, only the cursory presentation or review above has been provided. The present inventive concept is related to the fact that if a variable transformer is used, much better performance can be obtained than could previously be obtained using the various approaches of the prior art.

In FIG. 2, a piece of metal 52 is used as the reflecting device portion of the transformer. In other words, signals traveling down transmission line 48 are reflected in the central part of the figure by the element 52. Element 52 is one quarter-wavelength wide and provides a sudden transition in the transmission line 50 between a 50 ohm impedance line, as shown, and a 22.4 ohm impedance line over the width of element or metal 52. The transmission line impedance again increases to 50 ohms for the remaining distance of the cutout 54. The transmission line then reverts to the impedance of line 46 for the remaining travel. Since element 52 is variable in position, the reflection coefficient angle may be varied to accommodate the critical device. The magnitude of the reflection coefficient is determined by the physical size of element 52.

FIG. 3 is very similar to that of FIG. 2 except element 60 is dielectric material rather than ground plane material. However, the same result is obtained of reflection of signals at the place on transmission line 50 where it becomes contiguous with element 60.

One embodiment of the inventive concept is illustrated in FIG. 4 where the arm 85 is moved along the illustrated path to change the distance between transformer element 99 and transmission line 86 to adjust the phase of the reflection coefficient angle. This arrangement is not as desirable as that illustrated in FIGS. 2 and 3 since there will be a slight change in angle of the leading edge of the element 99 with respect to the transmission line 83 over the range of travel. This will cause some slight distortion but was satisfactory for one application of the inventive concept.

Referring finally to FIG. 1, if only the transformer shown as 12 is used, a large improvement in device operation for transistor 16 is obtained as opposed to using a fixed transformer. The addition of variable transformer 24 provides approximately 10% more improvement, other than that above, in amplifier operation.

While several embodiments of the inventive concept have been illustrated and a brief review has been provided for an approach to be used in designing transformer size, the inventive concept is not to be limited by the embodiments shown but only by the scope of the inventive concept as defined by the appended claims wherein:

I claim:

1. Apparatus for matching a transmission line to a transistor input impedance comprising, in combination:
    signal supply means;
    transistor means including signal input means;
    transmission line means connecting said signal supply means to said signal input means;
    quarter-wavelength signal reflection means adjacent said transmission line means; and
    means for moving said reflection means in a direction parallel to an axis of said transmission line while remaining adjacent said transmission line to adjust the relative values of resistive and reactive impedances as seen by said signal input means of said transistor means the reflection means being designed whereby the reflection coefficient angle increases with increases in frequency of operation.

2. Apparatus as described in claim 1 wherein said reflection means comprises transformer means.

3. The method of minimizing noise in a transistor means receiving signals from a transmission line comprising the steps of:
    configuring a signal reflection means of one-fourth the wavelength of the base frequency to be passed by said transistor means; and
    moving said reflection means along the axis of signal propagation of said transmission line to a point thereon wherein a minimum noise figure is obtained the reflection coefficient angle increasing with increases in frequency of operation.

4. The method of reducing noise in a transistor over a range of frequencies of operation from a center frequency comprising the steps of:
    matching the impedance of a signal source transmission line having a reflection coefficient angle to a signal input lead of a transistor means; and
    increasing the reflection coefficient angle with increases in frequency of operation.

5. Apparatus for increasing performance characteristics of an FET transistor fed by transmission line means comprising, in combination:
    signal supply transmission line means;
    means for tuning the reflection coefficient angle of said line means as seen by a signal input means of a connected transistor; and
    adjustment means for increasing the angle of the reflection coefficient at the input terminal of the transistor when operation at an increase in frequency is desired.

6. Apparatus as claimed in claim 5 comprising in addition:
    transistor means including a signal input means and first and second output means; and
    means connecting said signal input means to said transistor means by said signal supply transmission line means.

7. Apparatus comprising, in combination:
    transistor means including input means and output means;
    transmission line signal supply means for supplying input signals; and
    variable input signal reflection coefficient angle means connecting said input means of said transistor means and said transmission line signal supply means for optimally matching impedances whereby the reflection coefficient angle changes directly as a function of frequency.

8. The method of maximizing gain in a transistor means receiving signals from a transmission line comprising the steps of:
    configuring a signal reflection means to one-fourth the wavelength of the mean frequency to be passed by said transistor means; and
    moving said reflection means in a direction coincident with the axis along the length of said transmission line to a point thereon wherein a maximum gain figure is obtained.

* * * * *